(12) United States Patent
LeMaistre

(10) Patent No.: US 9,032,117 B2
(45) Date of Patent: May 12, 2015

(54) ACTIVE CABLE WITH DISPLAY

(71) Applicant: Cisco Technology, Inc., San Jose, CA (US)

(72) Inventor: Patrick G. LeMaistre, Winnipeg (CA)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 13/938,430

(22) Filed: Jul. 10, 2013

(65) Prior Publication Data

US 2015/0015403 A1 Jan. 15, 2015

(51) Int. Cl.
*G06F 3/00* (2006.01)
*G06F 13/28* (2006.01)
*G08B 5/22* (2006.01)
*G01R 19/155* (2006.01)

(52) U.S. Cl.
CPC .............. *G08B 5/22* (2013.01); *G01R 19/155* (2013.01)

(58) Field of Classification Search
None
See application file for complete search history.

(56) References Cited

U.S. PATENT DOCUMENTS

| 6,434,716 | B1 | 8/2002 | Johnson et al. | |
|---|---|---|---|---|
| 6,826,631 | B2 | 11/2004 | Webb | |
| 7,049,937 | B1 | 5/2006 | Zweig et al. | |
| 7,701,880 | B2 | 4/2010 | Klein et al. | |
| 7,921,235 | B2 * | 4/2011 | Best et al. | 710/15 |
| 8,082,368 | B2 | 12/2011 | Hsu et al. | |
| 8,184,933 | B1 | 5/2012 | Aybay | |
| 8,675,496 | B2 | 3/2014 | Johnston et al. | |
| 2004/0059806 | A1 | 3/2004 | Webb | |
| 2007/0229122 | A1 * | 10/2007 | Kiyozaki | 327/108 |
| 2008/0222532 | A1 | 9/2008 | Mester et al. | |
| 2009/0088908 | A1 | 4/2009 | Karam | |
| 2012/0064772 | A1 | 3/2012 | Pocrass | |

FOREIGN PATENT DOCUMENTS

WO 2013063300 A1 5/2013

OTHER PUBLICATIONS

"802.3at-2009 Power over Ethernet (PoE) Plus Standard Ratified"; Sep. 14, 2009; TMCnet Bloggers; http://blog.tmcnet.com/blog/tom-keating/voip/8023at-2009-power-over-ethernet-poe-plus-standard-ratified.asp.*
International Search Report and the Written Opinion, PCT/US2014/044481, mailed Jan. 5, 2015, 11 pages.

* cited by examiner

*Primary Examiner* — Kris Rhu
(74) *Attorney, Agent, or Firm* — Edell, Shapiro & Finnan, LLC

(57) ABSTRACT

An apparatus comprises a cable including conductors to carry data signals and a power voltage from a device when the cable is connected to the device, and at least one active display assembly fixed along a length of the cable. The active display assembly includes a power converter connected to the conductors to convert the power voltage to a supply voltage, and a programmable display and a controller powered by the power converter. The programmable display is configured to display programmed indicia responsive to the supply voltage, and the controller is configured to program the display.

27 Claims, 7 Drawing Sheets

US 9,032,117 B2

ACTIVE CABLE WITH DISPLAY

TECHNICAL FIELD

The present disclosure relates to cables and displays.

BACKGROUND

A network hub may include hundreds or even thousands of cables, such as Ethernet cables, to interconnect large numbers of racks of equipment, such as network devices, computing devices, storage devices, etc. The many cables traverse as many different physical paths throughout the hub to form complicated, confusing physical cable configurations. Thus, cable labeling schemes are necessary to identify the various cables and trace them to their respective end connections, e.g., to pair them with respective network device ports. One current scheme includes manually attaching printed labels to the cables. This approach is labor intensive, time consuming, expensive, inflexible, and does not lend itself to easy modification. Some cables incorporate light emitting diodes (LEDs) in the ends of the cables. The LEDs blink on and off to indicate link status and traffic, but fail to provide any further identifying information.

DESCRIPTION OF EXAMPLE EMBODIMENTS

Overview

An apparatus and related methods are presented herein, comprising a cable including conductors to carry data signals and a power voltage from a device when the cable is connected to the device, and at least one active display assembly fixed along a length of the cable. The active display assembly includes a power converter connected to the conductors to convert the power voltage to a supply voltage, and a programmable display configured to display programmed indicia responsive to the supply voltage. The active display assembly also includes a controller, powered by the supply voltage, to program the display. In one embodiment, the cable includes first and second end connectors configured to connect respectively with first and second devices, and the at least one active display assembly includes a first active display assembly fixed proximate the first end connector, and a second active display assembly fixed proximate the second end connector. The active display assembly is programmed to display alphanumeric information (indicia) to indicate one or more of, e.g., a cable identifier, device identifier, and network port identifier.

Example Embodiments

Figure 1:
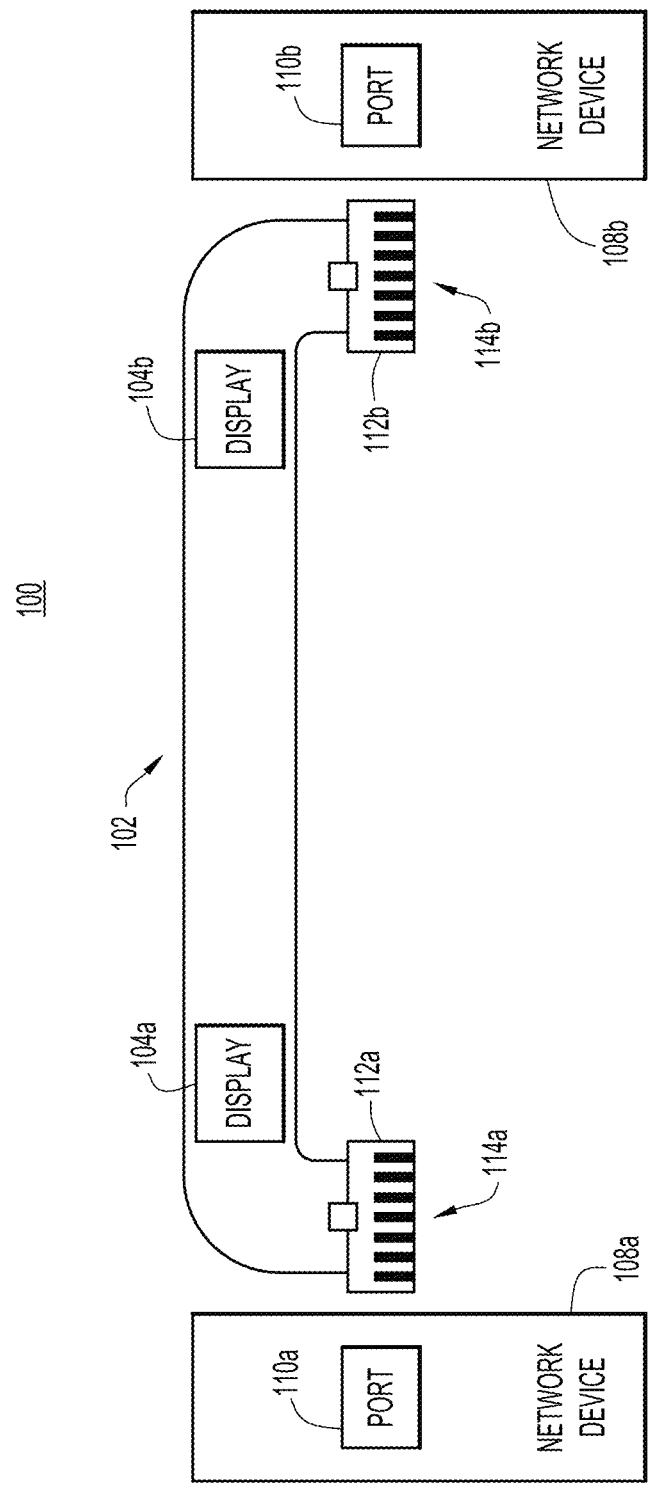
FIG. 1 is block diagram of a cable connection environment in which a network cable outfitted with active display assemblies configured in accordance with embodiments described herein may be used to inter-connect communication/network and other devices.

Referring first to FIG. 1, a cable connection environment 100 is shown in which a network cable 102 outfitted with active display assemblies 104a and 104b configured in accordance with embodiments described herein may be used to inter-connect communication/network devices 108a and 108b. Device 108a, 108b include respective network port connectors 110a, 110b. Cable 102 includes connector ends 112a, 112b to connect to respective device ports 110a, 110b. A device (e.g., device 108a or 108b) connected to cable 102 as just described is referred to herein as a "connected device" and may include a communications/network device, as well as a computing device or storage device.

Cable connector ends 112a, 112b each include a respective set of electrical contacts 114a, 114b to engage corresponding contacts in device port connectors 110a, 110b. Cable 102 encases electrical conductors (not seen in FIG. 1) extending the length of the cable to interconnect corresponding ones of electrical contacts 114a and 114b. Electrical contacts 114a, 114b each include one or more contacts designated to carry data signals and one or more contacts designated to carry a power voltage to/from devices 108a, 108b when the contacts engage corresponding contacts in device ports 110a, 110b. Thus, conductors of cable 102 interconnecting corresponding contacts 114a, 114b may carry data signals and one or more power voltages between devices 108a, 108b when the devices are connected to the cable.

When connected to cable 102, devices 108a, 108b may send and receive (i.e., transceive) data messages to and from each other via the data signals carried over the conductors in cable 102. In addition, one or both of devices 108a, 108b may be configured to apply a power voltage to one or more of the conductors in accordance with, e.g., a Power-Over-Ethernet (POE) standard, for example. In this way, the conductors of cable 102 may carry data signals and one or more power voltages between devices 108a, 108b in accordance with the POE standard.

An exemplary POE standard is the Institute of Electrical and Electronics Engineers (IEEE) 802.3af POE standard. Under IEEE 802.3af, direct current (DC) power (e.g., 48 volts DC) and data are both provided to remote devices over cables in an Ethernet network. The IEEE 802.3af standard does not require modification of existing Ethernet cabling infrastructure. Some transmission wire/conductors may be paired or otherwise bundled to increase the amount of power that can be provided over the cable to one or more remote devices. The DC power may be consumed by or passed-through the remote devices. Examples of the remote devices that may be powered using POE include communications and computing devices, image-capture devices, and display devices, such as active display assemblies 104a, 104b described herein. The data may be any type of data, analog or digital, that is passed over Ethernet mediums. Examples of data passed over cables in the embodiments described herein include video or audio data, image data, internet data, text data, or any other types of digital data that are processed by a tangible computer processor.

Active display assemblies 104a, 104b are fixed to cable 102 proximate cable connector ends 112a, 112b, respectively, for example, within an inch or two of the connector ends. The term "active" means display assemblies 104a, 104b each operate responsive to electrical power applied to the assembly, i.e., the assembly requires electrical power to perform at least some, but not necessarily all, of its intended functions. Each of active display assemblies 104a, 104b is fixed proximate the respective end of cable 102 as depicted in FIG. 1 so as to be connected with electrical conductors in cable 102 designated to carry the data signals and the power voltage when the cable is connected to at least one of devices 110a, 110b. Therefore, active display assemblies 104a, 104b (i) draw electrical power from respective ones of connected devices 108a, 108b over the cable conductors that carry the power voltage, and (ii) transceive data messages with each other and the connected devices via the data signals also carried on the cable conductors. In other words, active display assemblies 104a, 104b become activated, i.e., powered-on, and may transceiver data messages when cable 102 is connected to either or both of devices 108a, 108b. Each of active display assemblies 104a, 104b may each include a power back-up circuit to provide electrical power to the active display assembly after cable 102 is disconnected from the power voltage as a result of one or both of devices 108a, 108b being disconnected from cable 102.

Active display assemblies 104a, 104b each include an active programmable display device. The active programmable display device (also referred to herein simply as a "display") includes a display screen to display programmed indicia in the form of alpha-numeric text, for example, when the active display assembly is activated. In example applications, the displayed indicia may identify one or more of a cable identifier, a connected device identifier, and/or a network port identifier, e.g., "network port 001." The display screens of active display assemblies 104a, 104b may be preprogrammed to display respective default indicia when the active display assemblies are initially activated. In addition, and/or alternatively, connected devices 108a, 108b may program the displays of active display assemblies 104a, 104b to display respective indicia via data messages carried in the data signals to which the active display assemblies are connected. Connected devices 108a, 108b may also program the respective displays to act as beacons, e.g., to flash ON and OFF respectively displayed indicia.

Figure 2:
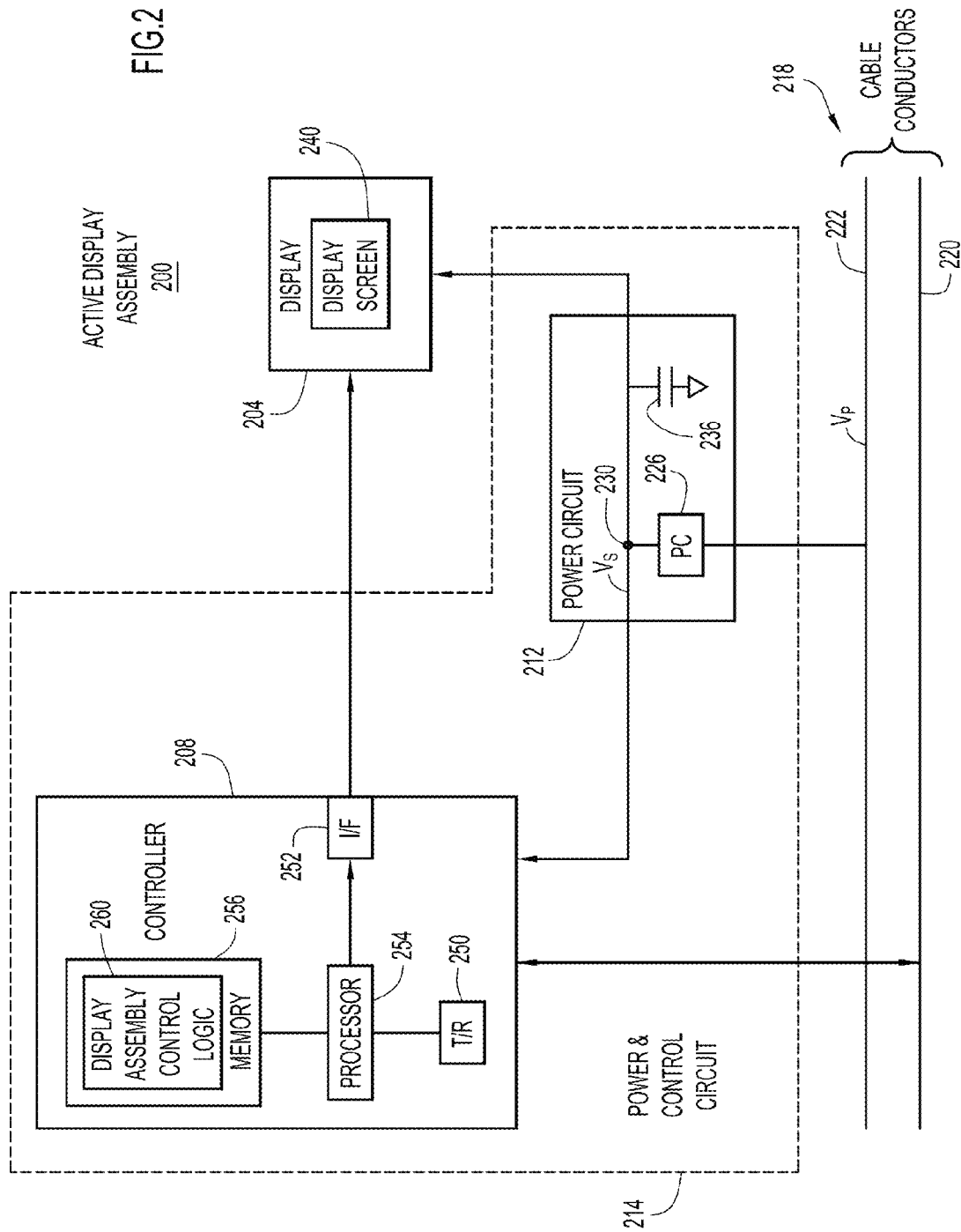
FIG. 2 is a circuit diagram of an example active display assembly.

Turning now to FIG. 2, there is shown a circuit/block diagram of an example active display assembly 200 corresponding to active display assemblies 104a, 104b from FIG. 1. Active display assembly 200 includes an active display device 204 (also referred to as a "display 204") to display programmed indicia, a controller 208 to control and program the display to display the indicia, and a power circuit 212 to power the display and controller. Controller 208 and power circuit 212 collectively represent a Power and Control Circuit 214 of active display assembly 200. Electrical conductors 218 of, e.g., cable 102, include one or more conductors 220 to carry data signals from/to devices connected to the cable, and one or more conductors 222 to carry a power voltage $V_P$ impressed thereon by one or more of the devices. In another embodiment, data signals and the power voltage may be carried on the same conductors. Controller 208 is connected to data signal conductor 220 and power converter 212 is connected to power voltage conductor 222. Therefore, power converter 212 is said to be connected to the power voltage $V_P$.

Power circuit 212 includes a power converter 226 to convert power voltage $V_P$ to a circuit supply voltage $V_S$ and apply the supply voltage $V_S$ to an output node 230 of the power converter that is also connected to power rails of controller 208 and display 204. Thus, power converter 212 provides supply voltage $V_S$ to controller 208 and display 204 to power/activate the controller and display responsive to power voltage $V_P$. In one embodiment, power converter 226 is a DC-DC converter to convert a 48 volt DC voltage ($V_P$) consistent with the POE standard to a nominal supply voltage in a range of 3.0-4.5 volts ($V_S$) in order to power controller 208 and display 204. In another embodiment, power converter 226 produces multiple different supply voltages as necessary to power controller 208 and display 204. Power converter 212 also includes a power back-up circuit 236, e.g., in the form of a storage capacitor connected to output node 230 and a ground rail of active display assembly 200.

In operation, assume a device connected to cable 102 (e.g., device 108a or 108b) applies supply voltage $V_P$ to conductor 222. Responsive to power voltage $V_P$, power converter 230 derives supply voltage $V_S$ and provides the supply voltage to controller 208, display 204, and capacitor 236. Capacitor 236 charges to the voltage $V_S$ through output node 230. Assume next that the device is disconnected from cable 102, thus removing $V_P$ from conductor 222. In response, power converter 226 is no longer able to deriver the supply voltage $V_S$. Instead, capacitor 236, previously charged to supply voltage $V_S$, provides a back-up voltage (and a capacitor discharge current) to controller 208 and display 204 to continue to power the controller and the display for a period of time after disconnection of the device and power voltage $V_P$.

Display 204 includes a display screen 240 to display programmed indicia thereon. Display screen 240 may be a programmable liquid crystal display (LCD), LED screen, or any other type of programmable display having a relatively small size, e.g., the screen may be an inch in length and a half-inch in width. Display screen 240 may be configured so that programmed indicia displayed thereon persists even after the power voltage $V_S$ has been removed. Display 204 includes a control interface to receive display commands, including but not limited to (i) commands to program/cause display screen 240 to display indicia, such as alpha-numeric characters, and (ii) commands to turn ON and turn OFF the display screen (and thus the programmed indicia thereon). Display 204 may be configured to display indicia in graphical form in addition to alpha-numeric form.

Controller 208 programs display 204 to display indicia responsive, in part, to data messages from connected devices received via data signals carried on conductors 220. Controller 208 includes a transceiver 250 to transceive data signals with connected devices over conductors 220, a display interface 252 through which the controller controls/programs display 204 to display indicia, a processor 254, and a memory 256. Processor 254 is, for example, a microprocessor, a microcontroller, a digital signal processor, etc. Transceiver 250 may be configured to convert (i) serialized data signals received from conductors 220 into data messages appropriately formatted for processor 254, and (ii) data messages from the processor into serialized data signals to be injected onto conductors 220 and carried to a connected device.

Memory 256 is a tangible processor-readable or computer-readable memory that stores or is encoded with instructions that, when executed by processor 254, cause the processor to perform the functions described herein. For example, memory 256 is encoded with Display Assembly Control logic 260. Memory 256 also stores data representative of indicia with which display 204 is to be programmed. While FIG. 2 shows a processing environment comprising a data processor 254 that executes software stored in memory 256, an alternative processing environment is a fixed data processing element, such as an application specific integrated circuit (ASIC) that is configured, through fixed hardware logic, to perform the functions of the logic 260. Yet another possible data processing environment is one involving one or more field programmable logic devices, or a combination of fixed processing elements and programmable logic devices. In one form, logic 260 may be embodied in a processor-readable medium that is encoded with instructions for execution by a processor that, when executed by the processor, operate to cause the processor to perform the functions described herein in connection with logic 260.

In one embodiment, Display Assembly Control logic 260 of controller 208 implements a data message exchange protocol with a connected device through which the controller may send data messages to the connected device and the connected device may send data messages to the controller. The data messages are carried to and from controller 208 via the data signals on conductors 220. The connected device sends data messages to controller 208 to cause the controller to program display 204 to display indicia or operate as a beacon. Example operational methods involving such message exchanges are described below in connection with FIGS. 4 and 6.

It is to be understood that each of devices 108a, 108b includes a controller similar to controller 208 to enable the device to perform the operations/functions described herein. That is, each of devices 108a, 108b includes an interface to permit the device to communicate with external devices/networks (such as other devices and active display assemblies 104a, 104b), a processor, and device memory. The device memory includes a tangible processor-readable or computer-readable memory that stores or is encoded with instructions that, when executed by the processor of the device, cause the processor of the device to perform the functions described herein.

Figure 3:
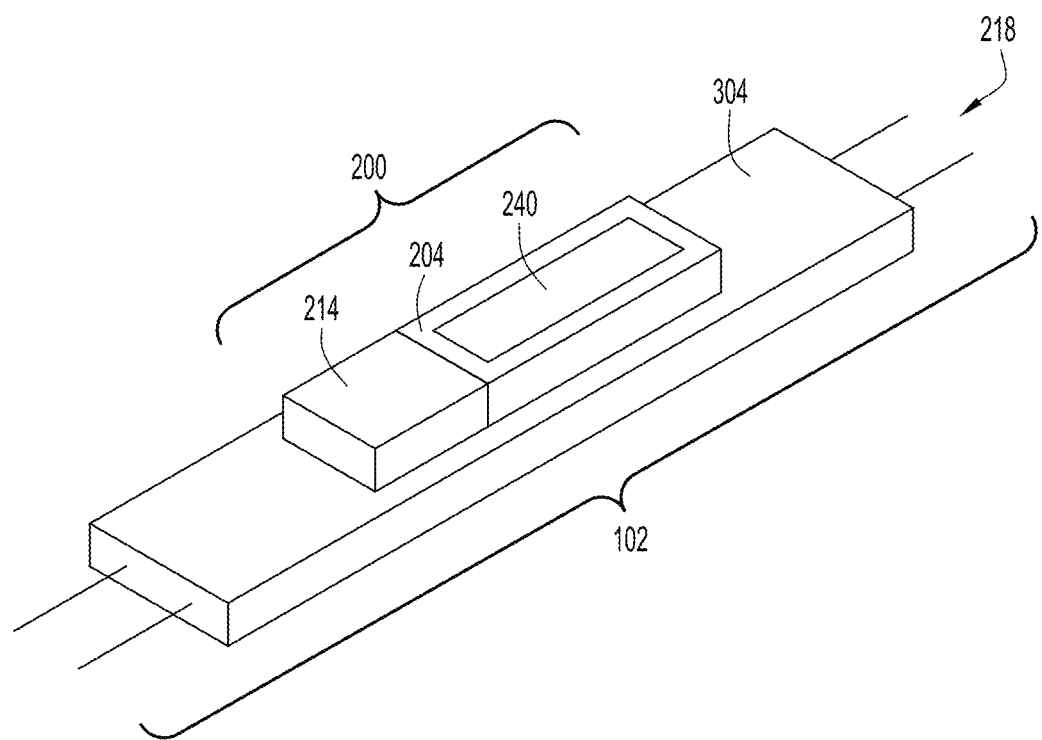
FIG. 3 is a perspective view of a physical package embodiment of an active display assembly fixed to a cable.

FIG. 3 is a perspective view of a physical package embodiment of active display assembly 200 fixed to cable 102. In the embodiment depicted in FIG. 3, power and control circuit 214 and display 204 of active display assembly 200 are connected to each other and physically configured to form essentially a single elongate package. Active display assembly 200 configured as the elongate package is fixed to a surface of an electrically insulating body 304 of cable 102. Though not seen in FIG. 3, conductors 218 of cable 102 extend through the insulating body 304 to connect with the active components of active display assembly 200, i.e., power and control assembly 214 and display 204. Active display assembly 200 is fixed to cable 102 in an orientation to ensure that display screen 240 (and indicia displayed thereon) faces away from cable body 304. Therefore, as depicted in FIG. 3, display screen 240 may be viewed from a position that is spaced apart from cable 102 and that faces the display screen. Cable insulating body 304 may substantially encapsulate all of active display assembly 200, except for display screen 240.

Figure 4:
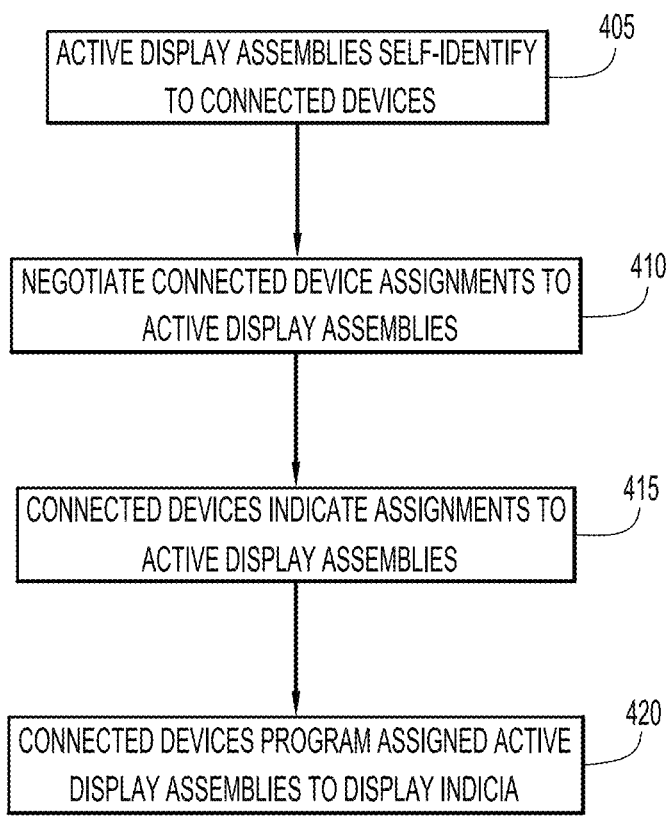
FIG. 4 is a flowchart of an example exchange of data messages in accordance with a message exchange protocol between communication devices connected to a cable and active display devices fixed to the cable.

Turning to FIG. 4, a flowchart depicts an example exchange of data messages between connected devices 108a, 108b and active display devices 104a, 104b in accordance with a message exchange protocol. Actions/operations depicted in FIG. 4 are operations performed by or with the assistance of Display Assembly Control logic 260 and corresponding logic residing in connected devices 108a, 108b, as appropriate.

At 405, each of active display assemblies 104a, 104b sends a self-identification data message to connected devices 108a, 108b. The self-identification data message includes an identifier of the sending active display assembly (i.e., an active display assembly ID), and indicates indicia with which the sending active display assembly is pre-programmed to display when it is initially powered-on.

At 410, connected devices 108a, 108b exchange data messages with each other to negotiate/determine which of the connected devices will be assigned to program which of the self-identified active display assemblies 104a, 104b. For example, devices 108a, 108b may be assigned respectively to program active display assemblies 104a, 104b. In another embodiment, only one of connected devices 108a, 108b may be assigned to program both of active display assemblies 104a, 104b.

At 415, each of connected devices 108a, 108b sends a data message to its assigned one of active display assemblies 104a, 104b to indicate the assignment at 410. The data message includes a connected device identifier. As a result, each of active display assemblies 104a, 104b knows to monitor data messages sent to it from its assigned connected device.

At 420, each of connected devices 108a, 108b sends a data message to its assigned one of active display assemblies 104a, 104b to display indicia. The active display assemblies may each be programmed to display the same indicia. The data message may also program the assigned display assembly to operate as a beacon so as to flash ON and OFF its displayed indicia, as described above.

Figure 5A:
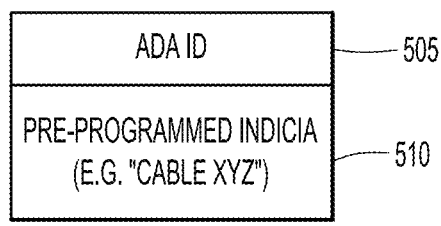
FIG. 5A is an example self-identification data message originated at an active display assembly.

Turning to FIG. 5A, there is shown an example self-identification data message 500 originated at an active display assembly at operation 405 in FIG. 4. Data message 500 includes a first field 505 indicating an active display assembly (ADA) ID and a second field 510 indicating indicia the active display assembly is pre-programmed to display upon initial power-on.

Figure 5B:
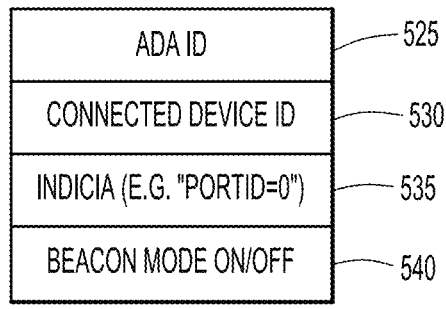
FIG. 5B is an example program data message sent from a connected device to an active display assembly to program an active display assembly to display indicia.

Turning to FIG. 5B, there is shown an example program indicia data message 520 sent from a connected device to an assigned active display assembly at operation 415 in FIG. 4 to program an active display assembly to display indicia. Data message 520 includes a first field 525 indicating an active display assembly (ADA) ID, a second field 530 indicating a connected device ID (the assigned device), a third field 535 indicating indicia with which to program the active display assembly to display, and a fourth field 540 indicating whether the active display assembly is to operate a beacon.

Figure 6A:
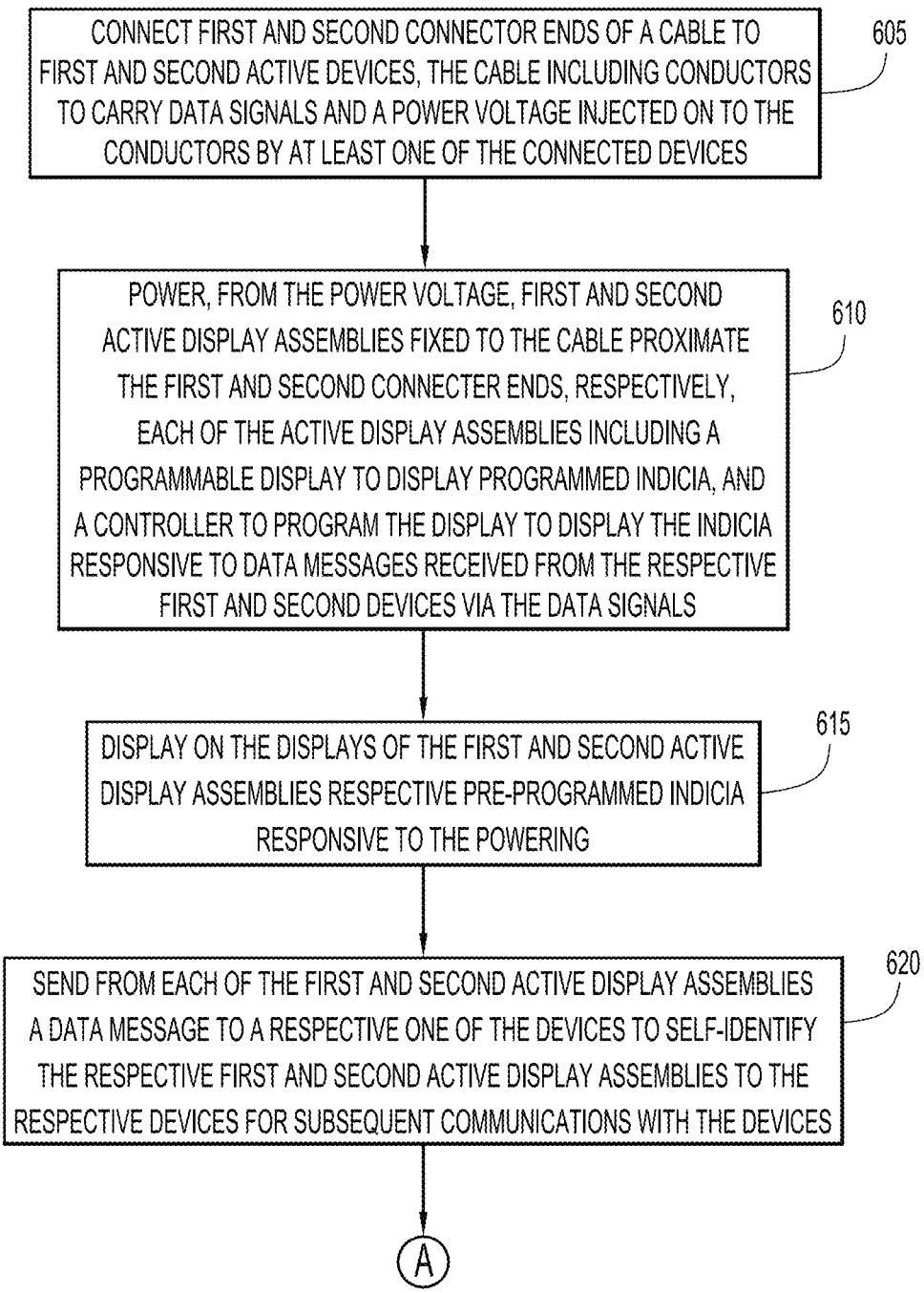
FIGS. 6A and 6B are a flowchart of a sequence of actions/operations related to an example use of a cable outfitted with active display assemblies.
Figure 6B:
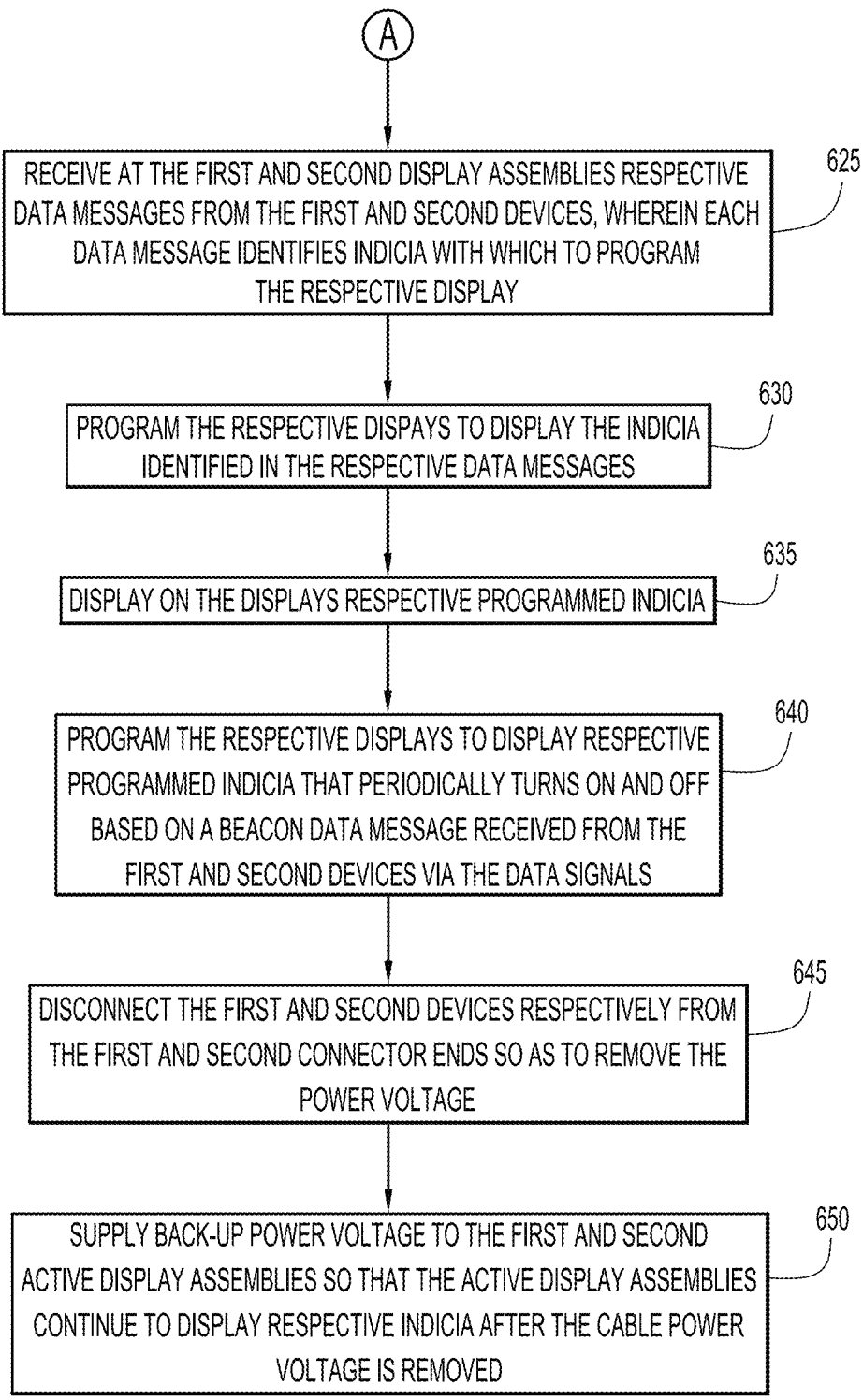

Turning to FIGS. 6A and 6B, a flowchart is provided that depicts a sequence of actions/operations 600 related to an example use of cable 102 as outfitted with active display assemblies 104a, 104b. In another embodiment, cable 102 may outfitted with only one active display assembly. Some, but not all, of the actions/operations depicted in FIGS. 6A and 6B are operations performed by or with the assistance of Display Assembly Control logic 260, as indicated in the description below.

At 605, first and second connector ends 112a, 112b of cable 102 are connected to first and second active devices 108a, 108b, where the cable includes conductors 220, 222 to carry data signals and a power voltage injected on to the conductors by at least one of the connected devices.

At 610, first and second active display assemblies 104a, 104b fixed to cable 102 proximate the first and second connecter ends, respectively, are powered from the power voltage. Each of active display assemblies 104a, 104b includes a programmable display to display programmed indicia on a display screen thereof, and a controller to program the display (through logic 260) to display the programmed indicia responsive to a data message received from a respective one of the first and second devices via the data signals.

At 615, the displays of the first and second active display assemblies 104a, 104b are programmed (by respective logic 260) to display respective pre-programmed indicia in responsive to being powered at 610. This referred to as self- or auto-labeling because a connected device is only required for the power voltage it provides.

At 620, each of first and second active display assemblies 104a, 104b sends a data message (originating with respective logic 260, see, e.g., data message 500 of FIG. 5A) to a respective one of the devices 108a, 108b to self-identify the respective first and second active display assemblies to the respective devices for subsequent communications with the devices.

At 625, first and second active display assemblies 104a, 104b receive respective data messages (see, e.g., data message 520 of FIG. 5B) from first and second devices 108a, 108b, wherein each data message identifies indicia with which to program the respective display.

At 630, respective displays of first and second active display assemblies 104a, 104b are programmed (by respective logic 260) to display the indicia identified in the respective data messages.

At 635, the displays display the respective programmed indicia.

At 640, the respective displays are programmed (by respective logic 260) to display respective programmed indicia that periodically turns ON and OFF based on a beacon data message received from the first and second devices via the data signals.

At 645, first and second devices 108a, 108b are respectively disconnected from first and second cable connector ends 112a, 112b so as to remove the power voltage from first and second active display assemblies 104a, 104b.

At 650, supply back-up power voltage to first and second active display assemblies 104a, 104b so that they continue to display respective indicia after the power voltage is removed.

Described herein are techniques for automatically labeling a cable using one or more active display assemblies fixed to and powered by the cable. The active display assemblies advantageously self-label themselves when activated by a connected device. The connected devices may program and re-program the active display assemblies to display indicia identifying the cable and/or device to which the cable is identified. This is done automatically—under computer control—without manually affixing new printed labels to the cable. The active display assembly may also be programmed to flash ON and OFF as a beacon as a cable location aid. The active display assembly may include power back-up capability so that it displays programmed indicia after a connected device powering the display is disconnected. The cable may be any kind of cable, including but not limited to any Ethernet cable, High-Definition Multimedia Interface (HDMI) cable, RJ45 telecommunications and computer cables, twin-axial (Twinax) cable, small form-factor pluggable (SFP) cable, and so on.

In summary, in one form, an apparatus is provided comprising: a cable including conductors to carry data signals and a power voltage from a device when the cable is connected to the device; and at least one active display assembly, fixed along a length of the cable, and including: a power converter connected to the conductors and configured to convert the power voltage to a supply voltage; and a display configured to display programmed indicia responsive to the supply voltage. The active display assembly may further include a controller connected to the supply voltage and configured to program the display to display the indicia. The controller may be further configured to receive a program data message from the device via the data signals, wherein the program data message identifies alphanumeric indicia with which to program the display, and program the display to display the alphanumeric indicia. The indicia may include one of a network device port identifier and a cable identifier. The controller may be further configured to program the display to periodically flash the indicia ON and OFF responsive to a beacon data message from the device. The controller may be further configured to send a self-identification data message to the device via the data signals when the controller is initially powered ON, wherein the self-identification data message includes an identifier of the active display assembly. The power voltage may be a direct current (DC) voltage, and the power converter includes a DC-to-DC converter to convert the DC power voltage to a DC supply voltage to power the controller and the display. The power converter may include a power supply back-up circuit, connected to the power voltage and the supply voltage, configured to provide a back-up supply voltage to the display when the power voltage is interrupted.

The cable may also include first and second end connectors configured to connect respectively with first and second devices, wherein the at least one active display assembly comprises a first active display assembly fixed proximate the first end connector, and a second active display assemble fixed proximate the second end connector. The respective controllers of the first and second active cable assemblies may each be configured to: receive a program data message from a respective one of the first and second devices via the data signals, wherein the program data message identifies indicia with which to program the respective display; and program the respective display to display the indicia responsive to the received program data message.

The respective received program data messages from the first and second devices may each identify matching indicia with which to program the respective displays of the first and second active display assemblies, and the controllers may program the respective displays to display the matching indicia.

The display may be liquid crystal (LCD) display. The cable may be an Ethernet cable and the power voltage is in accordance with a Power-over-Ethernet (POE) standard. The cable may include a casing through which the conductors extend, and the display may be fixed to the casing so that the display indicia is viewable from a position spaced from the cable. The display may be configured to display pre-programmed indicia responsive to the supply voltage.

In another form, an apparatus is provided, including: a cable including first and second end connectors to connect with respective first and second active devices, the cable including conductors to carry data signals and a power voltage injected onto the conductors by the devices; and first and second active display assemblies fixed to the cable proximate the first and second end connectors, respectively, each active display assembly connected to and configured to be powered by the power voltage. Each active display assembly includes: a display configured to display programmed indicia; and a controller configured to: receive a program data message from a respective one of the first and second devices via the data signals, wherein the program data message identifies indicia with which to program the display; and responsive to the received program data message, program the display to display the indicia.

The received program data messages each identify matching indicia with which to program the respective displays of the first and second active display assemblies, and the controllers may program the respective displays with the matching indicia.

In still another form, a method is provided comprising: connecting first and second connector ends of a cable to first and second active devices, the cable including conductors to carry data signals and a power voltage injected on to the conductors by at least one of the connected devices; powering, from the power voltage, first and second active display assemblies fixed to the cable proximate the first and second connecter ends, respectively, each active display assembly including a display to display programmed indicia, and a controller to program the display to display the programmed indicia responsive to a data message received from a respective one of the first and second devices via the data signals; displaying on the displays of the first and second active display assemblies respective pre-programmed indicia responsive to the powering; receiving at the first and second active display assemblies respective data messages from the first and second devices, wherein each data message identifies indicia with which to program the respective display; programming the respective displays of the first and second active display assemblies to display the indicia identified in the respective data messages; and displaying on the displays the respective programmed indicia.

The method may further comprise programming the respective displays of the first and second active display assemblies to display respective programmed indicia that periodically turns ON and OFF based on a beacon data message received from the first and second devices via the data signals. The method may further comprise disconnecting the first and second devices respectively from the first and second connector ends so as to remove power voltage from the conductors, and supplying back-up power voltage to the first and second display assemblies so that the display assemblies continue to display respective indicia after the disconnecting.

Although the apparatus, system, and method are illustrated and described herein as embodied in one or more specific examples, it is nevertheless not intended to be limited to the details shown, since various modifications and structural changes may be made therein without departing from the scope of the apparatus, system, and method and within the scope and range of equivalents of the claims. Accordingly, it is appropriate that the appended claims be construed broadly and in a manner consistent with the scope of the apparatus, system, and method, as set forth in the following claims.

What is claimed is:

1. An apparatus comprising:
    a cable including conductors to carry data signals and a power voltage from a device when the cable is connected to the device; and
    at least one active display assembly, fixed along a length of the cable, and including:
        a power converter connected to the conductors and configured to convert the power voltage to a supply voltage;
        a display configured to display programmed indicia responsive to the supply voltage; and
        a controller, connected to the supply voltage, to program the display to display the indicia, wherein the controller:
            receives a program data message from the device via the data signals, the program data message identifying alphanumeric indicia with which to program the display; and
            programs the display to display the alphanumeric indicia.

2. The apparatus of claim 1, wherein the indicia includes one of a network device port identifier and a cable identifier.

3. The apparatus of claim 1, wherein the controller is further configured to program the display to periodically flash the indicia ON and OFF responsive to a beacon data message from the device.

4. The apparatus of claim 1, wherein the controller is further configured to:
    send a self-identification data message to the device via the data signals when the controller is initially powered ON, wherein the self-identification data message includes an identifier of the active display assembly.

5. The apparatus of claim 1, wherein the power voltage is a direct current (DC) voltage, and the power converter includes a DC-to-DC converter to convert the DC power voltage to a DC supply voltage to power the controller and the display.

6. The apparatus of claim 1, wherein the power converter includes a power supply back-up circuit, connected to the power voltage and the supply voltage, configured to provide a back-up supply voltage to the display when the power voltage is interrupted.

7. The apparatus of claim 1, wherein:
    the cable includes first and second end connectors configured to connect respectively with first and second devices; and
    the at least one active display assembly comprises:
        a first active display assembly fixed proximate the first end connector; and
        a second active display assemble fixed proximate the second end connector.

8. The apparatus of claim 7, wherein the respective controllers of the first and second active cable assemblies are each configured to:
    receive a program data message from a respective one of the first and second devices via the data signals, wherein the program data message identifies indicia with which to program the respective display; and
    program the respective display to display the indicia responsive to the received program data message.

9. The apparatus of claim 8, wherein:
    the respective received program data messages from the first and second devices each identify matching indicia with which to program the respective displays of the first and second active display assemblies; and
    the controllers program the respective displays to display the matching indicia.

10. The apparatus of claim 1, wherein the display is a liquid crystal (LCD) display.

11. The apparatus of claim 1, wherein the cable is an Ethernet cable and the power voltage is in accordance with a Power-over-Ethernet (POE) standard.

12. The apparatus of claim 1, wherein:
    the cable includes a casing through which the conductors extend; and
    the display is fixed to the casing so that the display indicia is viewable from a position spaced from the cable.

13. The apparatus of claim 1, wherein the display is configured to display pre-programmed indicia responsive to the supply voltage.

14. An apparatus comprising:
    a cable including first and second end connectors to connect with respective first and second active devices, the cable including conductors to carry data signals and a power voltage injected onto the conductors by the devices; and
    first and second active display assemblies fixed to the cable proximate the first and second end connectors, respectively, each active display assembly connected to and configured to be powered by the power voltage, each active display assembly including:

a display configured to display programmed indicia; and a controller configured to:
receive a program data message from a respective one of the first and second devices via the data signals, wherein the program data message identifies indicia with which to program the display; and
responsive to the received program data message, program the display to display the indicia.

15. The apparatus of claim 14, wherein:
the received program data messages each identify matching indicia with which to program the respective displays of the first and second active display assemblies; and
the controllers program the respective displays with the matching indicia.

16. The apparatus of claim 14, wherein each controller is further configured to:
receive a beacon data message from the respective device; and
program the display to periodically flash the indicia ON and OFF responsive to the beacon data message.

17. The apparatus of claim 14, wherein each active display assembly further comprises:
a power converter, connected to the conductor to carry the power voltage, configured to convert the power voltage to a supply voltage with which to power the respective controller and the respective display.

18. The apparatus of claim 14, wherein the cable is an Ethernet cable and the power voltage is in accordance with a Power-over-Ethernet (POE) standard.

19. The apparatus of claim 14, wherein each display is a liquid crystal (LCD) display.

20. The apparatus of claim 14, wherein the cable is an Ethernet cable and the power voltage is in accordance with a Power-over-Ethernet (POE) standard.

21. A method comprising:
connecting first and second connector ends of a cable to first and second active devices, the cable including conductors to carry data signals and a power voltage injected on to the conductors by at least one of the connected devices;
powering, from the power voltage, first and second active display assemblies fixed to the cable proximate the first and second connector ends, respectively, each active display assembly including a display to display programmed indicia, and a controller to program the display to display the programmed indicia responsive to a data message received from a respective one of the first and second devices via the data signals;
displaying on the displays of the first and second active display assemblies respective pre-programmed indicia responsive to the powering;
receiving at the first and second active display assemblies respective data messages from the first and second devices, wherein each data message identifies indicia with which to program the respective display;
programming the respective displays of the first and second active display assemblies to display the indicia identified in the respective data messages; and
displaying the respective programmed indicia on the respective displays.

22. The method of claim 21, further comprising:
programming the respective displays of the first and second active display assemblies to display respective programmed indicia that periodically turns ON and OFF based on a beacon data message received from the first and second devices via the data signals.

23. The method of claim 21, further comprising:
disconnecting the first and second devices respectively from the first and second connector ends so as to remove power voltage from the conductors; and
supplying back-up power voltage to the first and second display assemblies so that the display assemblies continue to display respective indicia after the disconnecting.

24. The method of claim 21, further comprising:
sending self-identification data messages from the first and second active display assemblies to the first and second active devices, respectively, each self-identification data message including an identifier of the respective sending active display assembly.

25. The method of claim 24, further comprising:
exchanging data messages between the first and second active devices over the cable to determine which of the first and second active devices will be assigned to program which of the first and second active display assemblies.

26. The method of claim 21, further comprising:
receiving at the first and second active display assemblies respective assignment data messages indicating respective ones of the first and second active devices to which the first and second active display assemblies are assigned.

27. The method of claim 26, further comprising:
receiving at the first and second active display assemblies, from the respective assigned ones of the first and second active devices, respective program data messages indicating indicia to be displayed by the respective first and second active display assemblies.

* * * * *